(12) United States Patent
Lepine et al.

(10) Patent No.: US 7,492,145 B2
(45) Date of Patent: Feb. 17, 2009

(54) ELECTRIC CURRENT SENSOR WITH A BRACKET ATTACHED TO THE CORE ON EITHER SIDE OF THE AIR-GAP AND OUTSIDE OF THE AIR GAP

(75) Inventors: Gerard Lepine, Peillonnex (FR); Olivier De Loriol, Gex (FR); Gilles Moret, Fessy (FR); Thierry Chevanard, Reignier (FR)

(73) Assignee: Liaisons Electroniques-Mecaniques LEM S.A., Plan-Les-Ouates (CH)

( * ) Notice: Subject to any disclaimer, the term of this patent is extended or adjusted under 35 U.S.C. 154(b) by 46 days.

(21) Appl. No.: 10/546,907

(22) PCT Filed: Jan. 20, 2004

(86) PCT No.: PCT/IB2004/000159

§ 371 (c)(1),
(2), (4) Date: Aug. 24, 2005

(87) PCT Pub. No.: WO2004/077078

PCT Pub. Date: Sep. 10, 2004

(65) Prior Publication Data

US 2006/0176047 A1    Aug. 10, 2006

(30) Foreign Application Priority Data

Feb. 27, 2003   (EP)   ................. 03004186

(51) Int. Cl.
*G01R 33/00* (2006.01)
*H01F 27/00* (2006.01)

(52) U.S. Cl. .................................. 324/158.1
(58) Field of Classification Search ............. 324/117 H
See application file for complete search history.

(56) References Cited

U.S. PATENT DOCUMENTS

| 4,262,275 | A |   | 4/1981 | DeMarco et al. |
| 4,901,008 | A | * | 2/1990 | Quastel et al. ........... 324/117 H |
| 5,221,894 | A | * | 6/1993 | Herwig .................... 324/117 R |
| 5,444,380 | A | * | 8/1995 | Bourgeois et al. ............ 324/529 |
| 5,552,700 | A | * | 9/1996 | Tanabe et al. ............ 324/117 H |
| 6,507,189 | B2 | * | 1/2003 | Woolsey et al. ......... 324/207.26 |
| 6,759,840 | B2 | * | 7/2004 | Marasch et al. .......... 324/117 H |

FOREIGN PATENT DOCUMENTS

| EP | 0475880 A | 3/1992 |
| JP | 63012971 A | 1/1988 |
| JP | 09281152 A | 10/1997 |
| JP | 2002 243768 A | 8/2002 |

* cited by examiner

*Primary Examiner*—Paresh Patel
(74) *Attorney, Agent, or Firm*—Clifford W. Browning; Krieg DeVault LLP

(57) ABSTRACT

An electric current sensor having a housing, magnetic circuit with a magnetic core, and a magnetic field detector with a detection cell, positioned in an air gap between ends of the core. The core is made of a non-laminated magnetic material, and the magnetic circuit has a strap made of non-magnetic material welded to the core at each side of the air gap. The magnetic field detector has a support plate on which the detection cell is mounted. The plate has a recess, opposition the detection cell, which houses one end of the magnetic circuit.

17 Claims, 5 Drawing Sheets

ELECTRIC CURRENT SENSOR WITH A BRACKET ATTACHED TO THE CORE ON EITHER SIDE OF THE AIR-GAP AND OUTSIDE OF THE AIR GAP

Applicant claims foreign priority benefits under 35 U.S.C. §§119(a)-(d) or (f), or §365(b) of European Patent Application No. 03004186.7, filed Feb. 27, 2003.

The present invention relates to an electric current sensor, in particular an open-loop electric current sensor.

BACKGROUND OF THE INVENTION

Numerous open-loop current sensors exist comprising a magnetic circuit having an air-gap and a Hall cell disposed in the air-gap for measuring the magnetic field induced by an electric current flowing along a conductor passing through the magnetic circuit. The magnetic circuit is typically made of a material that conducts magnetic flux, i.e. a "magnetic material", and that is laminate. The Hall cell can have electrical terminals in the form of pins mounted orthogonally on a printed circuit.

Conventional open-loop sensors of the above-mentioned type are relatively costly to manufacture due to the cost of manufacturing laminate magnetic circuits and due to cost of assembling the various components, in particular the Hall cell and the magnetic circuit in a housing, while complying with the dimensions and the tolerances of the air-gap and with the position of the Hall cell for guaranteeing good measurement accuracy.

Another problem with conventional open-loop current sensors is that they are not robust enough for certain uses, e.g. for use in the automobile field in which components must be capable of withstanding impacts and vibration without losing measurement accuracy. In certain uses, in which the current sensor must be resistant to the environment and airtight, the magnetic circuit and the Hall cell are covered with a resin. However, that can have detrimental consequences on measurement accuracy because of the different coefficients of expansion, in particular the different thermal and/or humidity coefficients of expansion, of the magnetic circuit, of the resin, and/or of the housing, giving rise to mechanical stresses being exerted on the magnetic circuit. Variation in the air-gap due to such stresses gives rise to errors in measuring the magnetic induction and thus in measuring the electric current.

BRIEF SUMMARY OF THE INVENTION

In view of the above-mentioned drawbacks, an object of the invention is to provide an electric current sensor that is robust, accurate, and inexpensive to manufacture.

It is advantageous to provide a current sensor that comprises few components that can be assembled in assembly steps that are relatively simple and that are adapted to automation.

It is advantageous to provide a current sensor that withstands the environment and that can be subjected to major variations in temperature without any significant loss in accuracy.

It is advantageous, for certain uses, to provide a current sensor that is capable of measuring electric currents in cables or other electrical conductors of large section.

In the present patent application, an electric current sensor is described, the sensor comprising a housing, a magnetic circuit comprising a magnetic core and a magnetic field detector that comprises a detector cell disposed in an air-gap in the magnetic circuit. The sensor may further comprise a connector portion having connection terminals for connecting the sensor to a processor unit for processing the measurement signals coming from the magnetic field detector. The sensor can have a central opening corresponding to the opening formed by the magnetic circuit so that a conductor, such as an electrical cable conveying the current to be measured can pass through the magnetic circuit. The housing can further comprise a support wall extending from the central opening for the purpose of fastening the sensor to an electrical cable or to an electrical conductor.

In a first aspect of the invention, the magnetic circuit of the sensor further comprises a bracket fastened rigidly, preferably by welding or by some other bonding technique, to the magnetic core on either side of the air-gap, the bracket being made of a material that is stronger than the material of the magnetic core. The magnetic core may be made of a soft, non-laminate magnetic material such as an FeNi alloy. The magnetic circuit can advantageously be subjected to an annealing operation after the bracket has been welded or otherwise bonded, for the purpose of obtaining optimum magnetic properties for the circuit. The bracket can further comprise an anti-rotation element in the form of a shoulder or of a tongue, in order to prevent the magnetic circuit from turning in the housing due to vibration while it is being used or while it is being manufactured, in particular while a lid is being ultrasonically sealed or welded to the housing in order to seal it in airtight manner. This makes it possible to guarantee that the magnetic circuit does not exert excessive stresses on the magnetic detector cell.

Advantageously, the bracket makes it possible to guarantee a predefined and constant length for the air-gap and to make the sensor more resistant to impacts and to stress due to relative thermal expansion between the magnetic core and other components in contact with the magnetic core, such as the housing. This solution also makes it possible to offer greater freedom in choosing the magnetic materials and to reduce the quantity of material forming the magnetic core.

Welding or otherwise bonding the bracket to the core is particularly advantageous since the welding or bonding operation can be automated and cutting operations on the magnetic core can be avoided.

The bracket may advantageously be made of shaped and stamped sheet metal.

The magnetic core may advantageously be formed of a solid filament of magnetic material that undergoes cutting and folding operations which are relatively simple operations that are easy to automate and that do not give rise to wastage of material.

In another aspect of the invention, the magnetic field detector comprises a detector cell that is surface mounted on a support board, e.g. a printed circuit board, the board being provided with a notch serving to receive one end of the core of the magnetic circuit, so that only the detector cell is inserted into the air-gap. Surface mounting, by using surface mount device (SMD) technology, makes it possible for the detector cell and the support board to be assembled automatically and for the detector cell to be positioned accurately on the support board, and also for the cell to be positioned accurately in the air-gap. The notch may also serve as a reference surface for positioning the magnetic circuit relative to the detector cell. This configuration also makes axial mounting, i.e. mounting that is essentially orthogonal to the midplane of the magnetic circuit, possible for the various components, in particular the magnetic field detector, the magnetic circuit, the lid, and the housing.

Sealing or welding the lid to the housing by ultrasound makes it possible to achieve good airtightness for the sensor while avoiding the need to fill a housing with resin, which suffers from the disadvantage of exerting mechanical stresses, in particular thermal stresses and/or stresses due to humidity, to the components inside the housing. Furthermore, the method of assembly is simplified and more conducive to mass production.

BRIEF DESCRIPTION OF THE DRAWING FIGURES

FIG. 2b is a view seen looking in the direction indicated by arrow IIb of FIG. 2a;

FIG. 3b is a view looking in the direction indicated by arrow IIIb of FIG. 3a.

DETAILED DESCRIPTION OF THE INVENTION

Figure 1A:
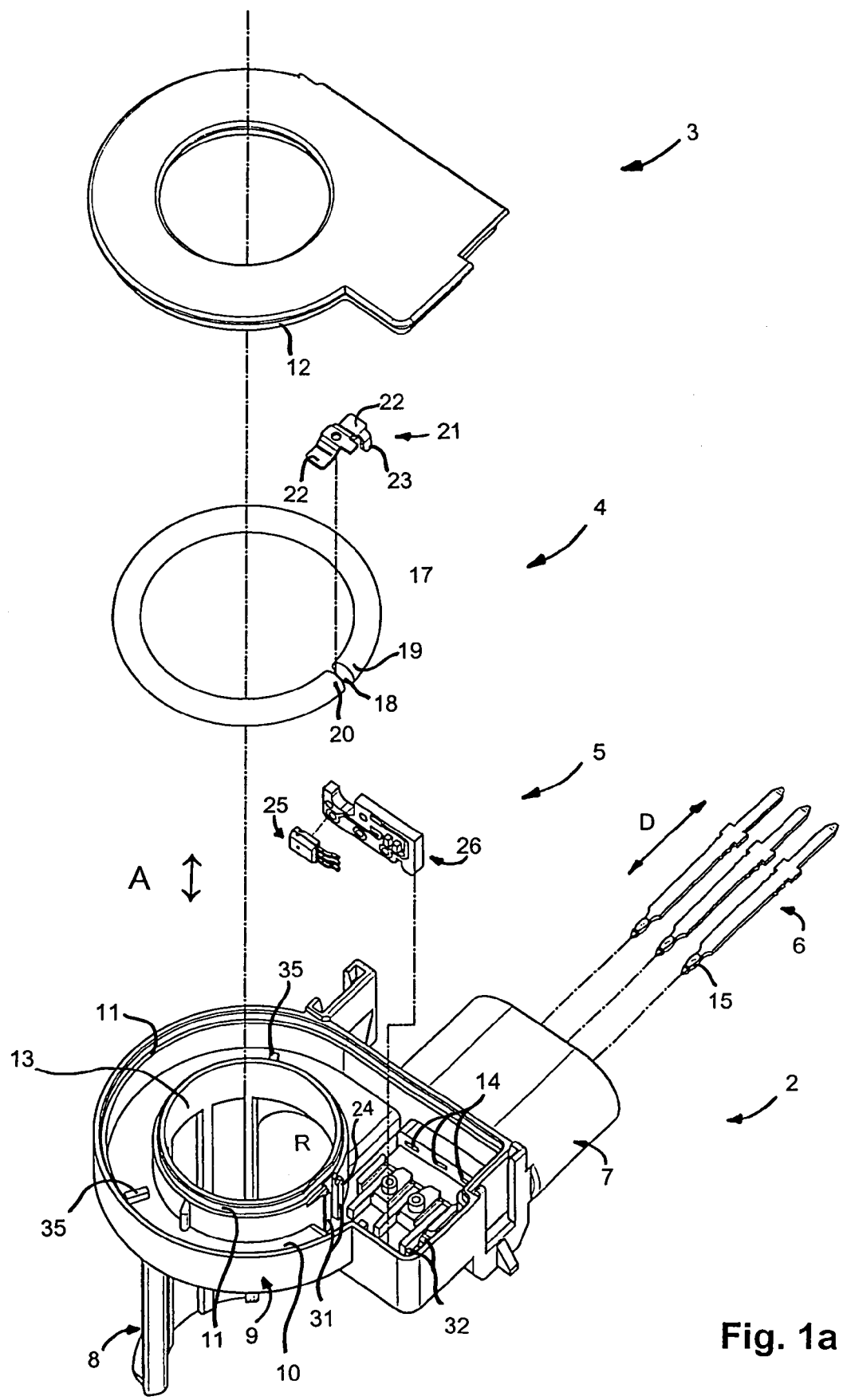
FIG. 1a is an exploded perspective view of a current sensor of the invention.

With reference to the figures, and in particular FIGS. 1a-1d, a current sensor 1 comprises a housing 2, a lid 3, a magnetic circuit 4, a magnetic field detector 5, and connection terminals 6.

The housing 2 has a connector portion 7, a fastening or support portion 8, and a body portion 9 defining a recess 10 in which the magnetic circuit 4 and the magnetic field detector 5 are mounted. The lid 3 is designed to close the open side 11 of the body portion 9, the body portion being provided with a rim 11 in which a complementary rim 12 on the lid 3 is received.

The body portion 9 is provided with a central opening 13 serving to pass a conductor along which the current to be measured flows. In the example shown, the conductor can, in particular, be a cable, e.g. the power supply cable of an automobile battery, the sensor delivering information to a system for managing and monitoring the battery. The support or fastening portion 8, which is in the form of a curved wall extending in an axial direction, i.e. in a direction essentially orthogonal to the midplane of the magnetic circuit, serves to fasten the sensor to the cable via a strip clamping the cable and the fastening portion 8. The fastening portion 8, the body portion 9, and the connector portion 7 of the housing can be formed integrally, e.g. of an injection-molded plastics material. The connection terminals 6 can be in the form of connection tongues inserted in a direction D that is substantially orthogonal to the axial direction A into orifices or passageways 14 provided for this purpose in the housing. The connection terminals having ends in the form of pins 15 which are inserted in interference-fit manner into metal-plated holes 16 in the magnetic field detector. The connection terminals 6 thus serve to connect the current sensor to an external processor unit for processing the measurement signals.

Figure 2A:
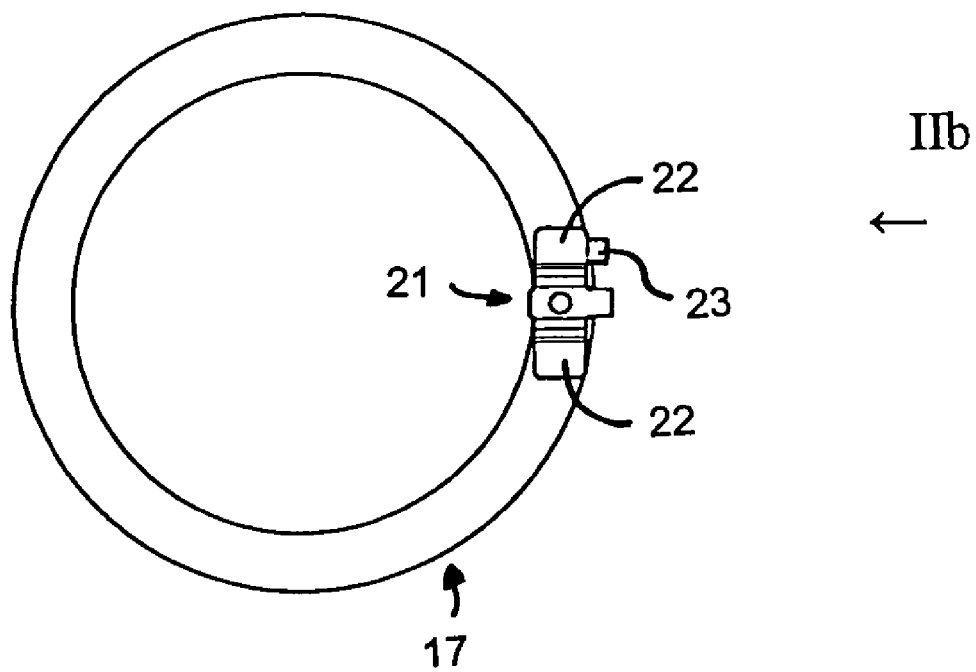
FIG. 2a is a view of a magnetic circuit and of brackets for the circuit, of a current sensor of the invention.
Figure 2B:
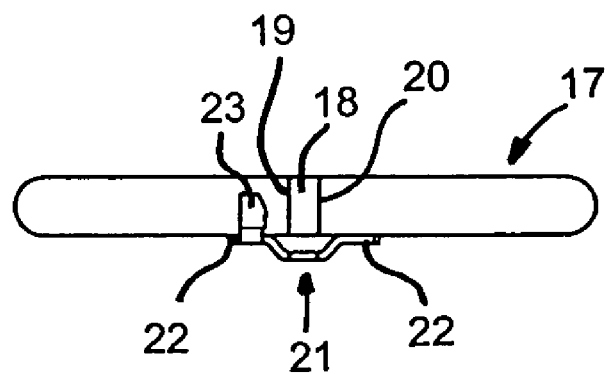

The magnetic circuit 4 comprises a core which, in this example, is in the form of a toroidal core 17 provided with an error-gap 18 formed between the free ends 19, 20 of the core as illustrated in FIGS. 2a, 2b. Preferably, the core 17 is made of a solid, i.e. non-laminate, magnetic material, said magnetic material being, for example, FeNi, which conducts magnetic flux with low hysteresis, but which is a poor conductor of electricity, in order to minimize losses due to eddy currents.

The essentially circular section of the core and its non-laminate construction make it possible to manufacture the core from a filament of material that is cut to the desired length and that is shaped by manufacturing steps that are relatively simple and without wasting material.

The magnetic circuit further comprises a bracket 21 made of a non-magnetic material that is stronger than the material of the core. The bracket 21 can advantageously be made of sheet stainless steel (or of other non-magnetic metals in sheet form) by forming and stamping. The bracket 21 has fastening portions 22 in the form of tabs designed to be welded, or otherwise bonded to the core 17 on either side of the air-gap 18. During the welding or bonding operation, the ends 19, 20 of the core 17 are pressed against a reference shim whose thickness corresponds to the desired length of the air-gap. After the welding or sealing operation, the magnetic circuit is annealed at a temperature making it possible to obtain good magnetic properties for the magnetic core. The bracket advantageously makes it possible to maintain the dimensions of the air-gap during this operation.

The bracket 21 can advantageously have an anti-rotation device, e.g. in the form of a tongue 23 which serves to prevent the magnetic circuit from turning relative to the support board. For this purpose, the tongue 23 comes into abutment against the support board 26. The magnetic circuit might turn during ultrasound welding or sealing methods in particular while the lid is being sealed to the housing by ultrasound. Sealing the lid to the housing by ultrasound makes it possible for good airtightness to be achieved at the interface 11, 12 between the lid and the housing.

Figure 3A:
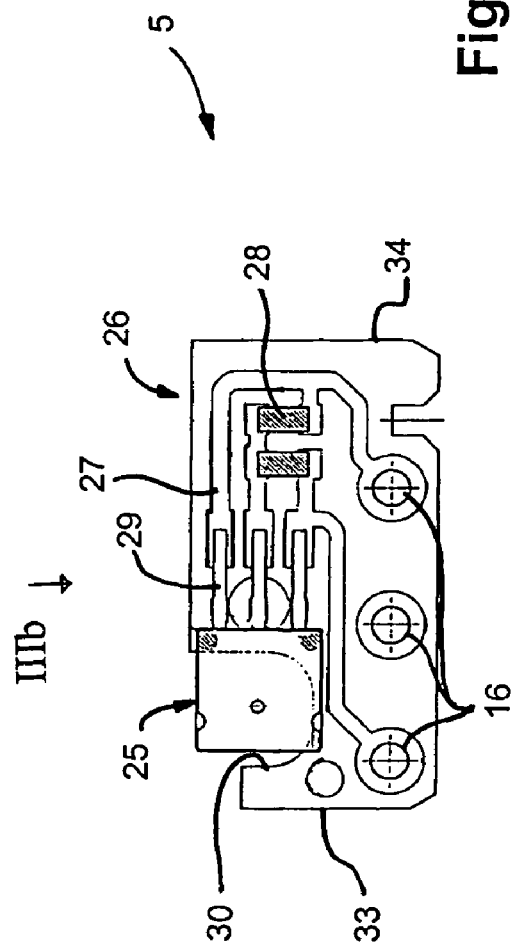
FIG. 3a is a view of a magnetic field detector of a sensor of the invention.
Figure 3B:
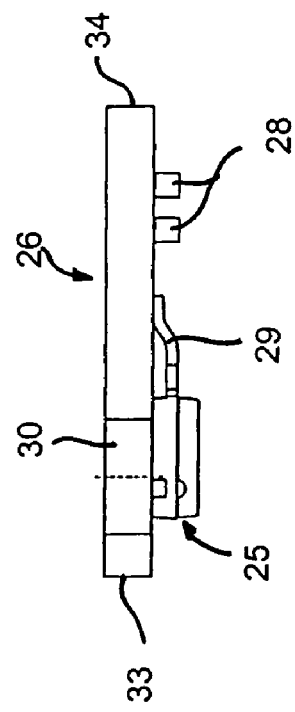

Referring in particular to FIGS. 3a, 3b, the magnetic filed detector comprises a detector cell 25 and a support board 26 on which the detector cell is mounted. The support board 26 can be a printed circuit having conductive tracks 27 for interconnecting the detector cell and the connection terminals 6 of the connector portion. Electronic components 28 can also be mounted on the support board. Advantageously, the detector cell 25 is provided with connection tabs 29 making it possible for it to be connected using surface mount device (SMD) technology. Such surface mounting makes it possible to automate mounting the cell on the support board and to obtain very good mounting and positioning accuracy of the cell relative to the support board. The support board has a notch 30 receiving one end 19 of the magnetic circuit, thereby making it possible to insert the detector cell 25 alone into the air-gap 17. The notch 30 has positioning surfaces 37, 38, 39 serving as reference surfaces for positioning the magnetic circuit relative to the magnetic field detector, and in particular relative to the detector cell 25.

Figure 1B:
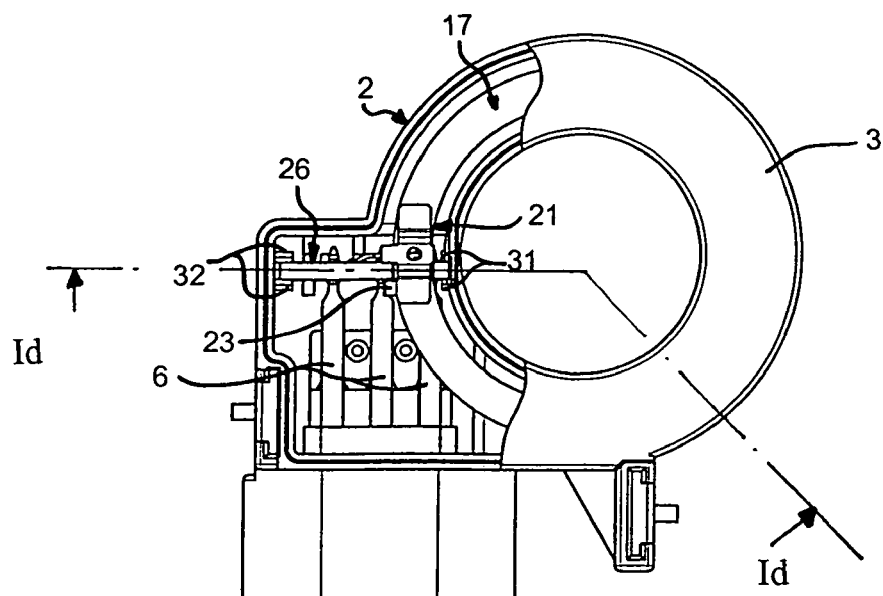
FIG. 1b is a plan view of a current sensor of the invention, with a potion of the lid cut away.
Figure 1D:
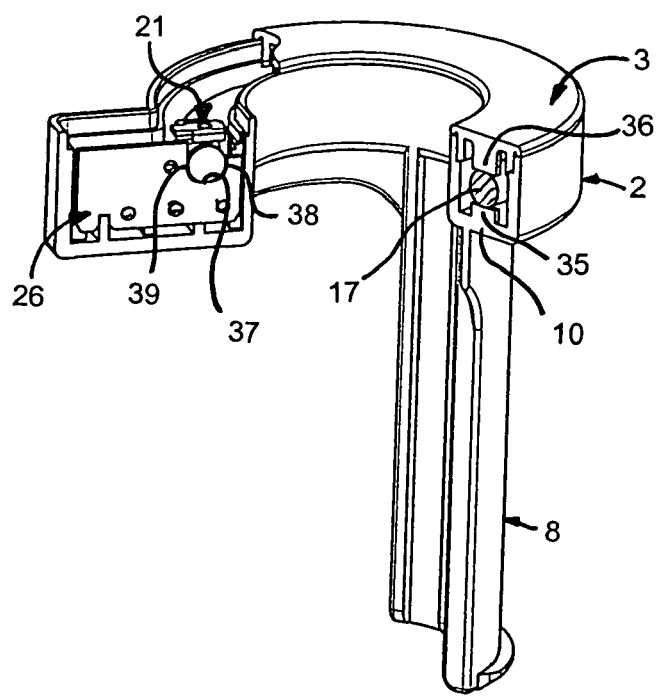
FIG. 1d is a perspective view of the current sensor on the section line Id-Id of FIG. 1b.
Figure 1C:
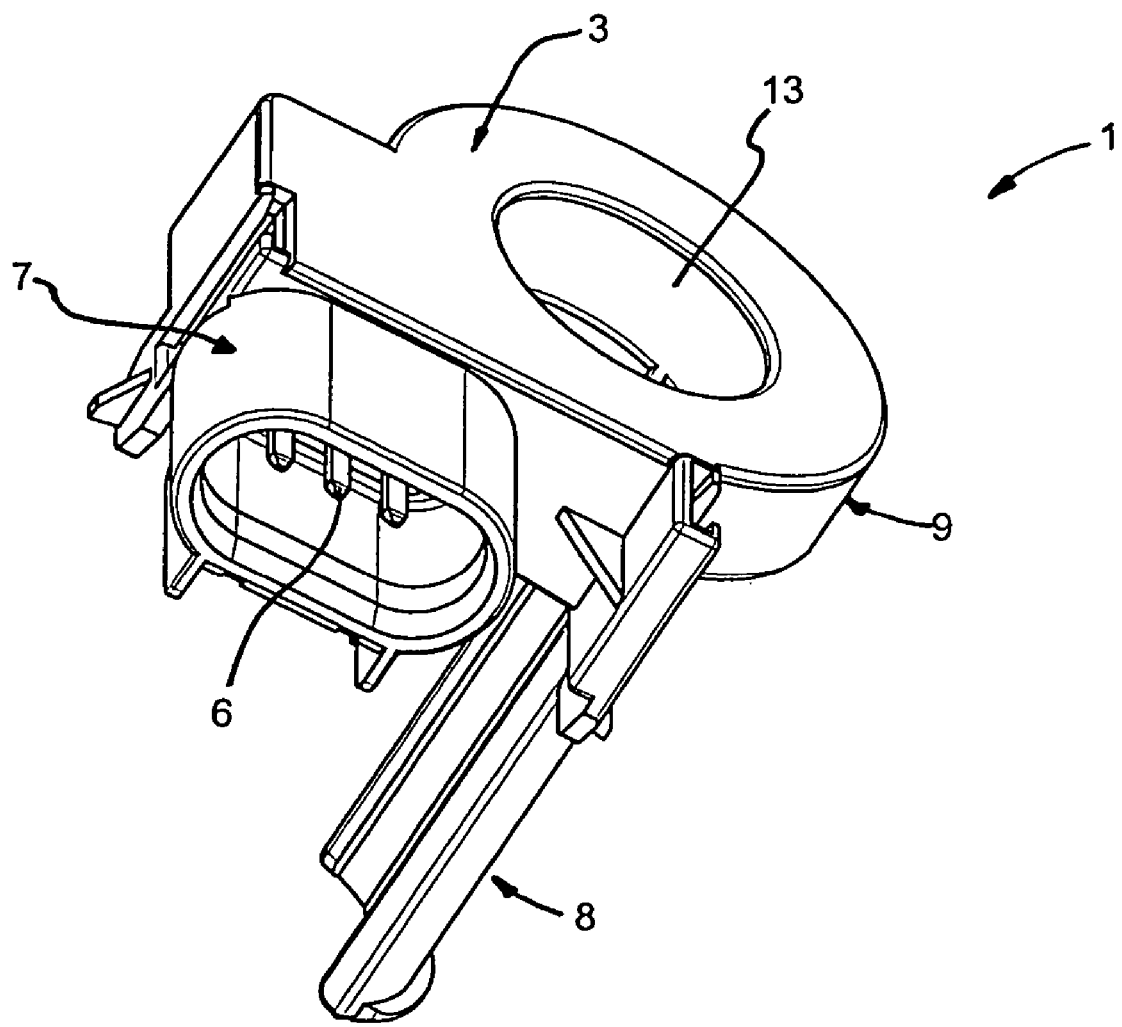
FIG. 1c is a perspective view of a current sensor of the invention.

The support board 26 is mounted and oriented in an axial plane, i.e. essentially orthogonally to the midplane of the magnetic core. In order to guide and to hold the magnetic filed detector in the housing, the housing is equipped with axial rails 31, 32 in which the opposite side ends 33, 34 of the support board are inserted and held as shown in FIGS. 1a, 1b, 1d. After mounting the magnetic field detector in the housing, the connection terminals 6 are inserted into the corresponding orifices 14 of the housing and the pins 15 are inserted by force into the metal-plated holes 16. The magnetic circuit 4 and the lid 12 are also mounted axially in, and respectively on the housing, thereby simplifying the steps of assembling the sensor.

The bottom of the recess 10 of the housing body and the inside surface of the lid can be provided with protuberances 35, 36 coming into abutment against the core of the magnetic circuit so as to hold it snugly between the lid and the housing. During the ultrasound sealing operation, the surfaces of the protuberances in abutment take on in part the rounded shape of the surface of the core. By these means, the magnetic circuit is thus held securely in the housing.

One of the advantages of the above-mentioned fastening means is that they enable the magnetic circuit to be put in place naturally inside the housing relative to the support board 26, and, in particular, they enable one end of the magnetic circuit to be put in place naturally in the notch 30. Once the magnetic circuit has taken up its natural position on the bottom of the housing, between the protuberances 35 and relative to the reference surfaces 37, 38, 39 of the support board 26, the protuberances 36 of the lid 3 apply a force in the axial direction of the magnetic circuit against the protuberances 35 on the bottom of the housing. The rounded shape that the surfaces of the protuberances take up as in abutment against the magnetic core during the ultrasound welding or sealing help to fasten the magnetic circuit rigidly in place in all directions, i.e. in the axial direction A and in the radial direction R.

Advantageously, a bracket can be welded or sealed to the core of the magnetic circuit on either side of the air-gap in an automated step, ensuring that the length of the air-gap is maintained at an essentially constant determined value even in the presence of thermal or mechanical stresses. The sensor withstands impacts and any resulting inertia forces that might give rise to permanent deformation of the core in the absence of the bracket. An advantageous consequence is that the magnetic circuits can be stored and transported loose, i.e. in bulk, thereby reducing handling costs.

The presence of the bracket makes it possible to use materials for the core that are optimized for their magnetic properties, without any particular attention being paid to the strength of the core.

In the present invention, it is possible, in particular, to use a core formed of a solid (non-laminate) filament which is relatively inexpensive to manufacture and which can be cut without wasting material. The bracket can easily be welded or otherwise bonded to the magnetic core in a method that is automated and that does not require any other cutting operation to be performed on the magnetic core.

The invention claimed is:

1. An electric current sensor for measuring a magnetic field induced by an electric current flowing through an electrical conductor, comprising a housing (2), a magnetic circuit (4) comprising a magnetic core and a magnetic field detector (5) that has a detector cell (25) that generates measurement signals disposed in an air-gap (18) formed between ends (19, 20) of said core, wherein the core (17) is made of a non-laminate magnetic material, the magnetic circuit further comprising a bracket (21) made of non-magnetic stamped sheet metal welded, bonded or fixed rigidly to the core on either side of the air-gap, outside of the air gap.

2. A sensor according to claim 1, wherein the bracket is provided with an anti-rotation element (23).

3. A sensor according to claim 1, further comprising a lid sealed or otherwise bonded by ultrasound to the housing so as to enclose the magnetic circuit in airtight manner in the recess in the housing.

4. A sensor according to claim 1, wherein the magnetic circuit is annealed after the bracket has been welded, bonded or fixed thereto.

5. A sensor according to claim 1, further comprising a lid sealed or otherwise bonded by ultrasound to the housing so as to enclose the magnetic circuit in airtight manner in the recess in the housing.

6. A sensor according to claim 1 wherein the lid is provided with protuberances coming into abutment against the magnetic circuit so that it is positioned in the housing after assembly.

7. An electric current sensor for measuring a magnetic field induced by an electric current flowing through an electrical conductor, comprising a housing (2), a magnetic circuit (4) comprising a magnetic core and a magnetic field detector (5) that has a detector cell (25) that generates measurement signals disposed in an air-gap (18) formed between ends (19, 20) of said core, wherein the core (17) is made of a non-laminate magnetic material, the magnetic circuit further comprising a bracket (21) made of a non-magnetic material welded, bonded or fixed rigidly to the core on either side of the air-gap and outside of the air gap, further comprising a lid sealed or otherwise bonded by ultrasound to the housing so as to enclose the magnetic circuit in airtight manner in the recess in the housing.

8. A sensor according to claim 7, wherein the lid is provided with protuberances coming into abutment against the magnetic circuit so that it is positioned in the housing after assembly.

9. A sensor according to claim 7, further comprising a lid sealed or otherwise bonded by ultrasound to the housing so as to enclose the magnetic circuit in airtight manner in the recess in the housing.

10. A sensor according to claim 7, wherein the bracket is provided with an anti-rotation element (23).

11. A sensor according to claim 7, wherein the magnetic circuit is annealed after the bracket has been welded, bonded or fixed thereto.

12. A sensor according claim 7, and further comprising a support board (26) in the form of a printed circuit having conductive tracks (27) connecting electrical connection terminals (29) of the detector cell (25) to connection terminals (6) of a connector portion of the sensor that serves for connection to an external processor unit for processing the measurement signals.

13. An electric current sensor for measuring a magnetic field induced by an electric current flowing though an electrical conductor, comprising a housing (2), a magnetic circuit (4) comprising a magnetic core and a magnetic field detector (5) that has a detector cell (25) that generates measurement signals disposed in an air-gap (18) formed between ends (19, 20) of said core, wherein the core (17) is made of a non-laminate magnetic material, the magnetic circuit further comprising a bracket (21) made of a non-magnetic material welded, bonded or fixed rigidly to the core on either side of the air-gap and outside of the air gap, and wherein the magnetic circuit is annealed after the bracket has been welded, bonded or fixed thereto.

14. A sensor according to claim 13, further comprising a lid sealed or otherwise bonded by ultrasound to the housing so as to enclose the magnetic circuit in airtight manner in the recess in the housing.

15. A sensor according to claim 13, wherein the bracket is provided with an anti-rotation element (23).

16. A sensor according to claim 13, further comprising a lid sealed or otherwise bonded by ultrasound to the housing so as to enclose the magnetic circuit in airtight manner in the recess in the housing.

17. A sensor according to claim 13 wherein the lid is provided with protuberances coming into abutment against the magnetic circuit so that it is positioned in the housing after assembly.

* * * * *